(12) United States Patent
Kimber et al.

(10) Patent No.: US 6,898,061 B1
(45) Date of Patent: May 24, 2005

(54) SYSTEM AND METHOD FOR DYNAMIC ESD PROTECTION

(75) Inventors: Kurt Kimber, Minneapolis, MN (US); David Litfin, Houlton, WI (US)

(73) Assignee: PolarFab, LLC, Bloomington, MN (US)

(*) Notice: Subject to any disclaimer, the term of this patent is extended or adjusted under 35 U.S.C. 154(b) by 25 days.

(21) Appl. No.: 10/616,801

(22) Filed: Jul. 10, 2003

(51) Int. Cl.[7] ............................................. H02H 09/00
(52) U.S. Cl. .................................................... 361/56
(58) Field of Search ........................... 361/56, 111, 119; 257/355, 356

(56) References Cited

U.S. PATENT DOCUMENTS

| | | | | |
|---|---|---|---|---|
| 4,692,834 A | * | 9/1987 | Iwahashi et al. | 361/56 |
| 5,946,177 A | * | 8/1999 | Miller et al. | 361/56 |
| 6,064,556 A | * | 5/2000 | Ravanelli | 361/111 |
| 6,429,489 B1 | | 8/2002 | Botula et al. | 257/355 |
| 6,549,061 B2 | | 4/2003 | Voldman et al. | 327/483 |
| 6,744,611 B2 | * | 6/2004 | Yang et al. | 361/56 |

OTHER PUBLICATIONS

"An On–Chip ESD Protection Circuit with Low Trigger Voltage in BiCMOS Technology", Albert Z. H. Wang and Chen–Hui Tsay, *IEEE Journal Journal of Solid–State Circuits*, vol. 36, No. 1, Jan. 2001.

* cited by examiner

Primary Examiner—Ronald Leja
(74) Attorney, Agent, or Firm—Kinney & Lange, P.A.

(57) ABSTRACT

A system and method for dynamically protecting a vulnerable device from an ESD event includes an ESD event sensor and a breakdown voltage adjustment circuit. The ESD event sensor detects an ESD event and provides a signal to the breakdown voltage adjustment circuit indicating that an ESD event has occurred. The breakdown voltage adjustment circuit receives the signal from the ESD event sensor and adjusts the breakdown voltage of the vulnerable device during the ESD event.

15 Claims, 5 Drawing Sheets

ESD EVENT SENSOR 42

Fig. 3

BREAKDOWN VOLTAGE
ADJUSTMENT CIRCUIT 44

SYSTEM AND METHOD FOR DYNAMIC ESD PROTECTION

BACKGROUND OF THE INVENTION

The present invention relates to an integrated circuit (IC), and more particularly to a system and method for protecting a vulnerable device within an IC from damage due to an electrostatic discharge (ESD).

IC manufacturing technology is continually improving. Advances in IC manufacturing technology have led to many improvements, including the ability to form smaller devices within an IC. In turn, this has resulted in the ability to fit more devices within a smaller sized chip. Unfortunately, these advances have also led to new problems. One of these problems is that the reduced device size decreases the ability of some devices to withstand an ESD event.

When an ESD event occurs on an external pad of an IC, it causes a large voltage spike to appear across some of the devices within the IC. If this sudden voltage spike is large enough, an internal device may experience a condition known as avalanche breakdown. When avalanche breakdown occurs, the device undergoes a snapback to a low holding voltage and large currents can flow through the device. These currents may become large enough to raise the device junction temperatures high enough to melt silicon, thus damaging or destroying the device. The voltage at which avalanche breakdown occurs across a device is known as the device's breakdown voltage.

Some devices, such as transistors, have multiple breakdown voltages depending on which junction the voltage is applied across, or whether the voltage is positive or negative. In addition, the current state of the device can have an effect on the magnitude of the breakdown voltage. For example, whether a transistor's base is open or shorted to the emitter can change the collector-emitter breakdown voltage of the transistor.

One method of protecting a vulnerable device from an ESD event is by increasing the size of the device. By increasing the size, the current carrying ability is increased, causing an increased tolerance to ESD events. However, this is often undesirable because an increased device size leads to an increase in the overall chip size.

Another method of protecting a device from an ESD event is to place an ESD clamp in parallel with the vulnerable device from the external pad to ground. An ESD clamp ensures that the voltage on the pad does not exceed the breakdown voltage of the device being protected. When the voltage across the device nears the breakdown voltage, the ESD clamp turns on and allows the ESD current to bypass the device. However, it is often undesirable to place an ESD clamp on an external pad because the ESD clamp adds an additional load to the pad, which is often undesirable during normal operation of the IC.

Another method used to protect a vulnerable device from an ESD event is to stack transistors in a cascode configuration. By stacking the transistors, the breakdown voltage is nearly doubled from that of a single transistor. Again, this configuration is beneficial during an ESD event but is often not desirable during normal operation of the IC.

Therefore, there is a need for a dynamic ESD protection system and method that would not interfere with the pad loading or normal operation of the IC, but would dynamically protect a vulnerable device from ESD without significantly increasing the overall size of the IC.

BRIEF SUMMARY OF THE INVENTION

The present invention is a system and method for dynamically protecting a vulnerable device from an ESD event. The circuit includes an ESD event sensor and a breakdown voltage adjustment circuit. The ESD event sensor senses an ESD event on an I/O pad and sends a signal to the breakdown voltage adjustment circuit when it has detected an ESD event. When this signal has been received, the breakdown voltage adjustment circuit dynamically adjusts the breakdown voltage of a vulnerable device. In this way, the breakdown voltage of the vulnerable device is raised such that the current is steered through an alternate path, avoiding the destruction of the vulnerable device.

When the ESD event sensor has determined that the ESD event is over, it sends a signal to the breakdown voltage adjustment circuit indicating that the ESD event is over. The breakdown voltage adjustment circuit receives the signal and returns the vulnerable device to normal operation.

DETAILED DESCRIPTION

Figure 1:
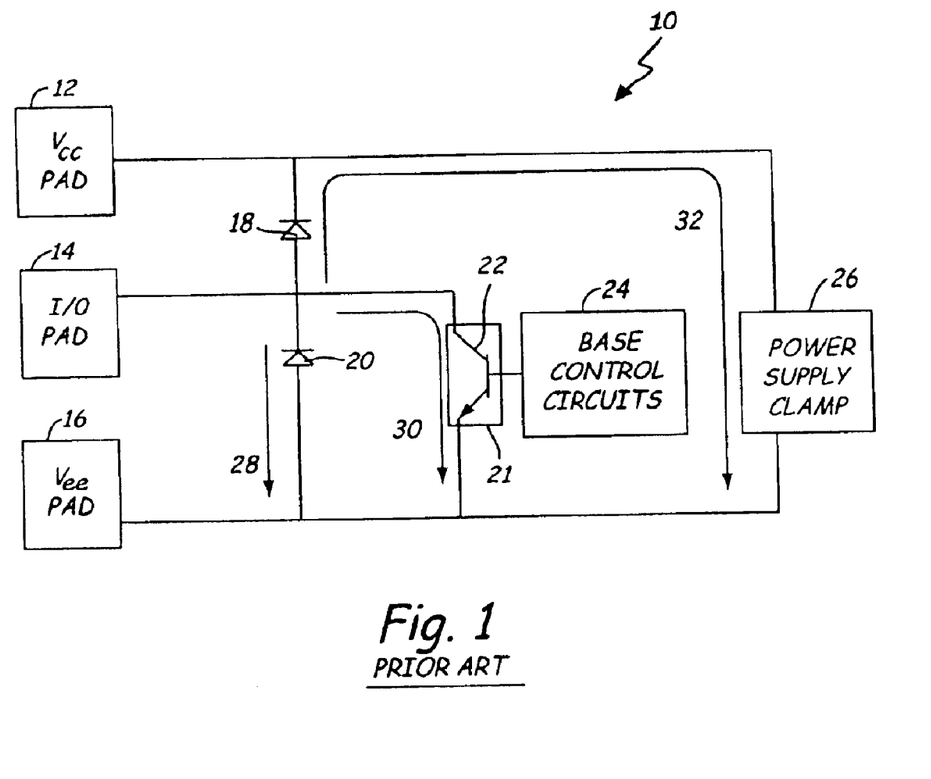
FIG. 1 illustrates an exemplary prior art global ESD protection circuit including a vulnerable device.

FIG. 1 illustrates an exemplary prior art global ESD protection circuit 10 including vulnerable device 21. FIG. 1 shows transistor 22 as exemplary vulnerable device 21. Circuit 10 includes Vcc pad 12, I/O pad 14, Vee pad 16, diodes 18 and 20, transistor 22, base control circuits 24, and power supply clamp 26. Diode 18 is forward biased between I/O pad 14 and Vcc pad 12. Diode 20 is connected in series with diode 18 and is forward biased between Vee pad 16 and I/O pad 14. Transistor 22 is connected such that its collector-emitter is in parallel with diode 20. Base control circuits 24 are connected to the base of transistor 22. Power supply clamp 26 is connected between Vcc pad 12 and Vee pad 16 and is connected across the series connected diodes 18 and 20. In an exemplary embodiment, Vcc pad 12 is connected to a positive fixed voltage power supply, and Vee pad 16 is connected to a ground of the power supply.

One possible ESD event that could damage vulnerable device 21, such as transistor 22, is when a positive ESD pulse occurs on I/O pad 14 with respect to Vee pad 16. During this ESD event, there are three different paths that the current could take. First, the current could go through reverse biased diode 20, as indicated by first path 28. Second, the current could go through transistor 22 as indicated by second path 30. Or third, the current could go through forward biased diode 18 and then through power supply clamp 26 as indicated by third path 32. In order to protect transistor 22 from the ESD event it is necessary to steer the current through this third path.

In order to steer the current through third path 32, the voltage required to push current through this path must be less than the voltage required to push current through either first path 28 or second path 30. It is known that the reverse breakdown voltage of diode 20 is much higher than the voltage required to push current through second path 30, and so an ESD event will not cause breakdown to occur through path 28. On the other hand, the breakdown voltage of transistor 22 varies during normal operation of the device. This is due to the fact that the breakdown voltage of transistor 22 changes depending on the current operating condition of the device. During normal operation, the breakdown voltage varies between the boundaries of the transistor's BVcbo (the breakdown voltage from the collector to the base with the emitter open) and BVceo (the breakdown voltage from the collector to the emitter with the base open). If an ESD event causes the voltage on an external pad to exceed the current breakdown voltage of transistor 22, transistor 22 will be damaged or destroyed.

Figure 2:
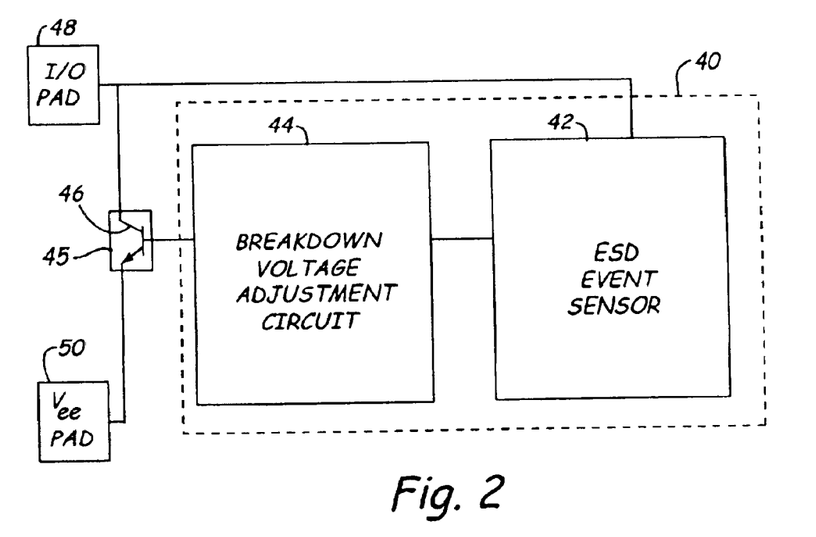
FIG. 2 illustrates the dynamic ESD protection system of the present invention.

FIG. 2 illustrates dynamic ESD protection system 40 of the present invention. Protection system 40 includes ESD event sensor 42 and breakdown voltage adjustment circuit 44. Protection system 40 is connected to a global ESD protection system (such as that shown in FIG. 1) which includes a vulnerable device 45 such as transistor 46, I/O pad 48, and Vee pad 50. The collector and emitter of transistor 46 are placed between I/O pad 48 and Vee pad 50. Breakdown voltage adjustment circuit 44 of protection system 40 is connected to the base of transistor 46. ESD event sensor 42 is connected between breakdown voltage adjustment circuit 44 and I/O pad 48.

The breakdown voltage of vulnerable device 45, such as transistor 46, is dependent upon the operating mode of the transistor. Different operating modes cause transistor 46 to have different breakdown voltages. The present invention takes advantage of this characteristic of transistor 46 by using protection system 40 to dynamically adjust the breakdown voltage of transistor 46 to the highest possible breakdown voltage during an ESD event, to protect transistor 46. This breakdown voltage, commonly referred to as BVces, provides the maximum protection available for the circuit configuration against an ESD event. BVces is the breakdown voltage from the collector to the emitter with the base shorted to the emitter. By adjusting the breakdown voltage to BVces, protection system 40 ensures that transistor 46 will not break down before all current is safely steered through the desired path (such as third path 32 shown in FIG. 1).

Protection system 40 includes ESD event sensor 42 and breakdown voltage adjustment circuit 44. The primary functions of ESD event sensor 42 are to sense an ESD event on I/O pad 48 and to send a signal to the breakdown voltage adjustment circuit when an ESD event is sensed on I/O pad 48. When breakdown voltage adjustment circuit 44 receives the signal, breakdown voltage adjustment circuit 44 adjusts the breakdown voltage of vulnerable device 45, such as transistor 46. The operation of ESD event sensor 42 and breakdown voltage adjustment circuit 44 will be now be described in more detail with reference to FIGS. 3 and 4.

Figures 3, 4:
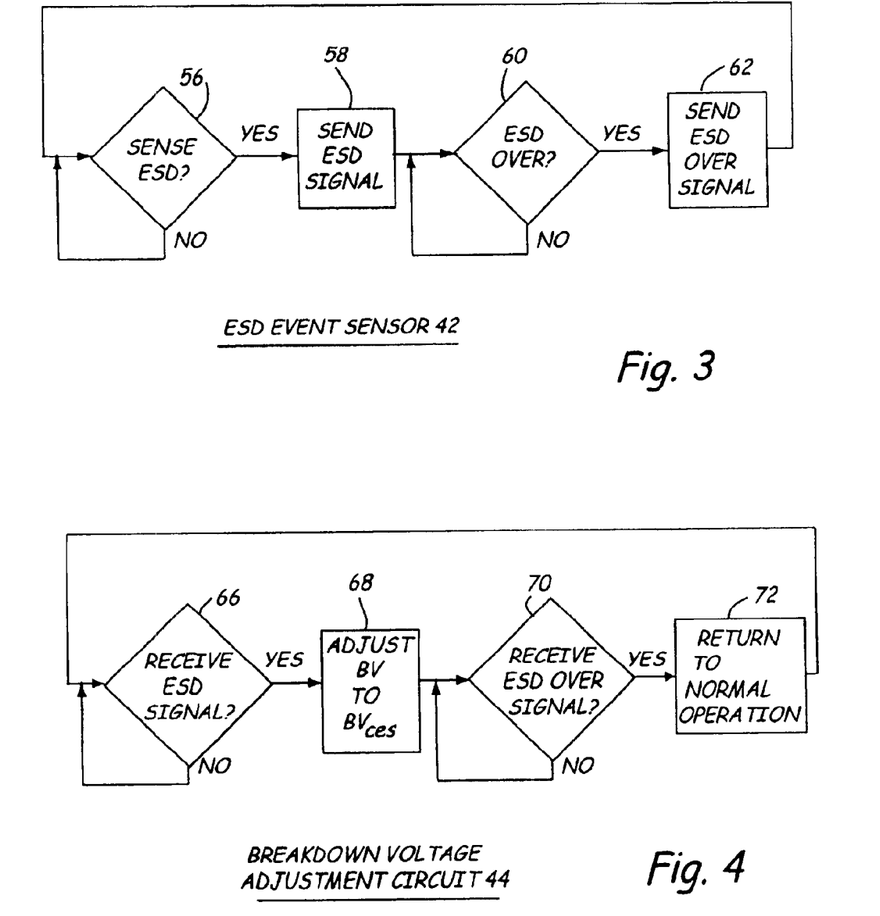
FIG. 3 is a flow diagram illustrating the steps performed by the ESD event sensor.
FIG. 4 is a flow diagram illustrating the steps performed by the breakdown voltage adjustment circuit.

FIG. 3 is a flow diagram illustrating the steps performed by ESD event sensor 42. The steps include sense ESD step 56, send ESD signal step 58, ESD over step 60, and send ESD over signal step 62. The steps occur in the order listed above and as shown in FIG. 3. The first step performed by ESD event sensor 42 is sense ESD step 56. The purpose of sense ESD step 56 is to monitor I/O pad 48 for an ESD event. Various methods are known for detecting an ESD event. One such method is to continually monitor the magnitude of the voltage on I/O pad 48. When the voltage exceeds a predetermined magnitude, the ESD event sensor 42 interprets the event as an ESD event. Another method of detecting an ESD event is to monitor the rate of change of the voltage on I/O pad 48. If the I/O pad's voltage rises faster than a predetermined rate, ESD event sensor 42 interprets the event as an ESD event.

After the ESD event has been received, ESD event sensor 42 performs send ESD signal step 58. Send ESD signal step 58 involves sending a signal to breakdown voltage adjustment circuit 44 indicating that an ESD event has occurred. The ESD event sensor then continues monitoring I/O pad 48, in ESD over step 60, to to determine when the ESD event is over. When ESD event sensor 42 determines that the ESD event is over, it performs send ESD over signal step 62. This step involves sending a signal to breakdown voltage adjustment circuit 44 indicating that the ESD event is over. At this point, ESD event sensor 42 returns to sense ESD step 56 and begins monitoring I/O pad 48 for another ESD event.

FIG. 4 is a flow diagram illustrating the steps performed by breakdown voltage adjustment circuit 44. The steps include receive ESD signal step 66, adjust BV to BVces step 68, receive ESD over signal step 70, and return to normal operation step 72. The steps occur in the order listed above and as shown in FIG. 4. The first step performed by breakdown voltage adjustment circuit 44 is receive ESD signal step 66. The purpose of receive ESD signal step 66 is to detect when the ESD event signal is sent from ESD event sensor 42.

After the ESD signal has been sensed, the breakdown voltage adjustment circuit 44 acts to protect transistor 46 from the ESD event. To do so, breakdown voltage adjustment circuit 44 performs the adjust BV to BVces step 68, which dynamically adjusts the breakdown voltage of transistor 46 to the highest possible breakdown voltage, namely BVces. This is accomplished by adjusting the voltage at the base of transistor 46 to a magnitude below the turn-on voltage of the base-emitter junction (Vbe_on) of transistor 46. In other words, the voltage magnitude on the base of transistor 46 is brought to approximately the voltage of Vee pad 50. With the voltage at the base of transistor 46 below Vbe_on, the transistor's breakdown voltage is kept sufficiently high to ensure that the ESD current will be steered through a safe path and will not damage transistor 46.

Once the breakdown voltage has been adjusted, breakdown voltage adjustment circuit 44 begins receive ESD over signal step 70. During this step, breakdown voltage adjustment circuit 44 waits to receive a signal from ESD event sensor 42 indicating that the ESD event has ended. When breakdown voltage adjustment circuit 44 receives the ESD over signal, it then performs return to normal operation step 72. During this step, breakdown voltage adjustment circuit 44 returns control of the base of transistor 46 to the base control circuits (such as base control circuit 24 in FIG. 1) to return transistor 46 to normal operation. At this point, breakdown voltage adjustment circuit 44 returns to receive ESD signal step 66 to wait for the next ESD event signal from ESD event sensor 42.

While there are many possible methods of performing the functions of ESD event sensor 42 and breakdown adjustment circuit 44, a few exemplary embodiments will now be discussed with reference to FIGS. 5 and 6.

Figure 5:
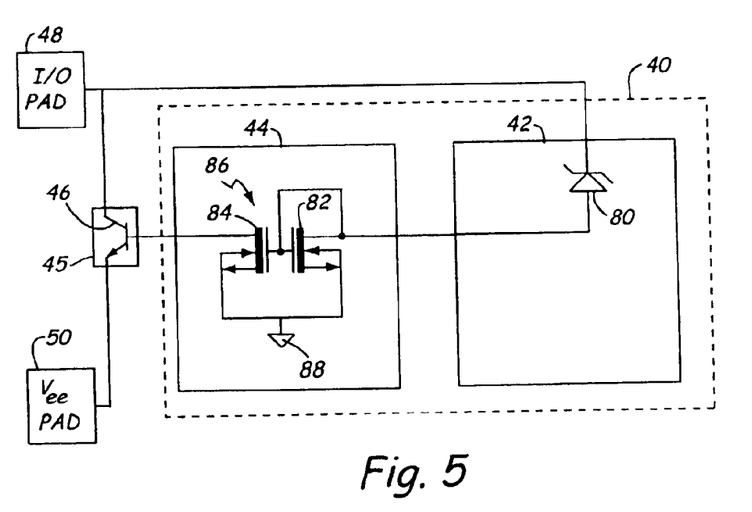
FIG. 5 is an exemplary embodiment of the protection system.

FIG. 5 is an exemplary embodiment of protection system 40. Protection system 40 includes ESD event sensor 42 and breakdown voltage adjustment circuit 44. ESD event sensor 42 includes zener diode 80. Breakdown voltage adjustment circuit 44 includes transistors 82 and 84 that are connected to form mirror 86. Mirror 86 is connected to ground 88. As previously described, protection system 40 is connected between I/O pad 48 and the base of transistor 46. Transistor 46 is an example of vulnerable device 45. The collector and emitter of transistor 46 are connected between I/O pad 48 and Vee pad 50.

In the exemplary embodiment shown in FIG. 5, ESD event sensor 42 comprises zener diode 80 reverse biased between I/O pad 48 and breakdown voltage adjustment circuit 44. In this embodiment, an ESD event is detected by monitoring the magnitude of the voltage on I/O pad 48. Zener diode 80 is designed according to two constraints. The first constraint is that during normal circuit operation, only an insignificant current should flow through zener diode 80, to avoid loading I/O pad 48. The second constraint is that the voltage (with respect to ground) at which current begins to flow through zener diode 80 must be less than BVceo for transistor 46. Preferably, the voltage required would be at least several volts less than BVceo of transistor 46. This ensures that zener diode 80 will turn on before breakdown of transistor 46 occurs.

Zener diode 80 performs all of the necessary functions of ESD event sensor 42. To sense an ESD event, zener diode 80 monitors the voltage on I/O pad 80. When an ESD event occurs, the voltage on the cathode of zener diode 80 rises until zener diode 80 breaks down and starts to conduct a significant amount of current. The current is sent to breakdown voltage adjustment circuit 44 as the ESD signal. Zener diode 80 continues conducting current until the voltage at I/O pad 48 has gone below the zener voltage of zener diode 80. At this point, zener diode 80 stops conducting current. The lack of current flow into breakdown voltage adjustment circuit 44 is the ESD over signal, which is sent to breakdown adjustment circuit 44 to indicate that the ESD event is over. Zener diode 80 then resumes monitoring the voltage of I/O pad 48.

Also in the exemplary embodiment of protection device 40, shown in FIG. 5, breakdown voltage adjustment circuit 44 comprises transistors 82 and 84, connected to form mirror 86, which is connected to ground 88. In an exemplary embodiment, transistors 82 and 84 are MOSFETs. To form mirror 86, the gate connections of transistors 82 and 84 are tied together and connected to the drain of transistor 82. The drain of transistor 82 is connected to ESD event sensor 42. The drain of transistor 84 is connected to the base of transistor 46. Both of the source connections of transistors 82 and 84 are connected to ground 88, as well as to the body connections of transistors 82 and 84. Ground connection 88 may be a connection to Vee pad 50 in an exemplary embodiment.

Mirror 86 performs all of the necessary functions of breakdown voltage adjustment circuit 44. During operation, mirror 86 monitors the current received from ESD event sensor 42 at the drain of transistor 82. When a significant amount of current begins to flow at the drain of transistor 82, mirror 86 recognizes the current as the ESD signal, and immediately takes action to prevent transistor 46 from being damaged. The current flow into the drain of transistor 82 is mirrored through transistor 84. Transistors 82 and 84 are sized such that transistor 84 will reliably pull the base of transistor 46 to a voltage less than Vbe_on in response to the current received from ESD event sensor 42. In this way, mirror 86 dynamically adjusts the breakdown voltage of transistor 46 from the normal operating condition to BVces during an ESD event.

After mirror 86 has adjusted the breakdown voltage of transistor 46, the mirror continues functioning until it receives the ESD over signal from ESD event sensor 42. The received ESD over signal, which occurs when the current stops being received from ESD sensor 42, stops the flow of current through mirror 86 which returns control of the base of transistor 46 to the base control circuits (such as base control circuits 24 shown in FIG. 1), and transistor 46 returns to its normal operating condition. Mirror 86 then waits for the next ESD signal from ESD event sensor 42.

Figure 6:
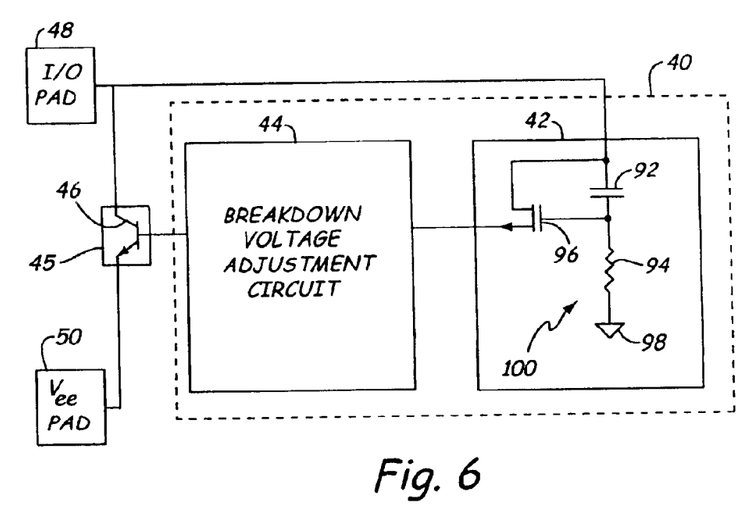
FIG. 6 shows another exemplary embodiment of the ESD event sensor.

FIG. 6 shows another exemplary embodiment of ESD event sensor 42. ESD event sensor 42 includes capacitor 92, resistor 94, and transistor 96 which are configured as RC trigger 100. Capacitor 92 is connected in series with resistor 94. The base of transistor 96 is connected between capacitor 92 and resistor 94. The end of resistor 94 opposite capacitor 92 and transistor 96 is connected to ground 98. The end of capacitor 92 opposite resistor 94 is connected to I/O pad 48 and to the drain of transistor 96. The source of transistor 96 is connected to breakdown voltage adjustment circuit 44. As previously described, breakdown voltage adjustment circuit 44 is connected to the base of transistor 46. The collector and emitter of transistor 46 are connected between I/O pad 48 and Vee pad 50.

RC trigger 100 performs all of the necessary functions of ESD event sensor 42. However, RC trigger 100 performs these functions in a different way than the previous embodiment. To determine whether an event is an ESD event, RC trigger 100 monitors I/O pad 48 for a high rate of change event. If the voltage on I/O pad 48 changes sufficiently rapidly, RC trigger 100 identifies the event as an ESD event and responds accordingly. To do this, RC trigger 100 includes capacitor 92 and resistor 94 which act as a high-pass filter. Any event with a slow rate of change is blocked by capacitor 92, but an event with a high rate of change passes through capacitor 92. When an ESD event occurs, capacitor 92 is charged and the voltage at the point between capacitor 92 and resistor 94 rises. This causes the voltage on the gate of transistor 96 to increase, resulting in current flow from the drain to the source of transistor 96. This current is sent to breakdown voltage adjustment circuit 44 as the ESD event signal, indicating than an ESD event has occurred. In designing RC trigger 100, the values of capacitor 92 and resistor 94 are selected to ensure that RC trigger 100 will only operate during an ESD event.

Once the high rate of change ESD event has ended, the RC trigger determines that the ESD event is over. At this point, capacitor 92 blocks all low rate of change events and the voltage between the resistor and the capacitor is reduced to approximately ground. Accordingly, the voltage at the gate of transistor 96 is reduced to approximately ground, and current stops flowing out of the source of transistor 96. When the current stops flowing out of the source of transistor 96, the breakdown voltage adjustment circuit 44 identifies the current change as the ESD over signal. RC trigger 100 then resumes monitoring I/O pad 48 for another high rate of change ESD event.

The present invention protects a vulnerable device, such as bipolar transistor 46, from damage due to an ESD event by dynamically adjusting the breakdown voltage of the device during the ESD event. While a number of exemplary embodiments have been described, it is recognized that many other circuits and devices could be utilized to perform the functions of protection system 40.

Although the present invention has been described with reference to preferred embodiments, workers skilled in the art will recognize that changes may be made in form and detail without departing from the spirit and scope of the invention. Particularly, while some forms of the invention are described in the form of discrete devices, it is recognized that the circuit is preferably reduced to practice in the form of an IC. Therefore, terms such as "device" and the like should be construed in their broadest contexts to include portions of ICs that are conveniently described as functional components, as well as discrete devices. Similarly, portions of the present invention have been described in terms of exemplary embodiments employing MOS transistor devices having a control region (gate) and multiple controlled regions (source and drain). It will be understood by those skilled in the art that the principles of the present invention are applicable to circuits that employ other active devices having control and controlled regions or terminals.

What is claimed is:

1. A system for dynamically protecting a vulnerable device from an ESD event comprising:
    an ESD event sensor, operable to detect the ESD event and provide a first signal when the ESD event is detected; and
    a breakdown voltage adjustment circuit connected to the ESD event sensor and to the vulnerable device, wherein the breakdown voltage adjustment circuit receives the first signal from the ESD event sensor and adjusts a breakdown voltage of the vulnerable device in response to the first signal.

2. The system of claim 1, wherein the ESD event sensor comprises a zener diode.

3. The system of claim 1, wherein the ESD event sensor comprises an RC trigger.

4. The system of claim 1, wherein the breakdown voltage adjustment circuit comprises a mirror.

5. The system of claim 1, wherein the breakdown voltage adjustment circuit adjusts the breakdown voltage of the vulnerable device by reducing a voltage on a base of the vulnerable device below a turn-on voltage of the vulnerable device.

6. The system of claim 1, wherein the vulnerable device is a transistor comprising a base, a collector, and an emitter; and wherein the breakdown voltage adjustment circuit adjusts the breakdown voltage of the vulnerable device from the normal operating condition to a breakdown voltage from the collector to the emitter with the base shorted to the emitter, during an ESD event.

7. The system of claim 1, wherein the ESD event sensor senses an end of the ESD event and provides a second signal when the end of the ESD event is sensed, and wherein the breakdown voltage adjustment circuit returns the vulnerable device to normal operation in response to the second signal.

8. A system for protecting a vulnerable device from an ESD event comprising:
    means for sensing the ESD event and providing a first signal when the ESD event is sensed; and
    means for adjusting a breakdown voltage of the vulnerable device in response to the first signal from the means for sensing the ESD event.

9. The system of claim 8, wherein the means for sensing the ESD event senses the ESD event by monitoring a voltage magnitude on an I/O pad.

10. The system of claim 8, wherein the means for sensing the ESD event senses the ESD event by monitoring a rate of change of a voltage on an I/O pad.

11. The system of claim 8, further comprising:
    means for sensing the end of the ESD event, and providing a second signal when the end of the ESD event is sensed; and
    means for returning the vulnerable device to normal operation in response to the second signal from the means for sensing the end of the ESD event.

12. A method for dynamically adjusting a breakdown voltage of a vulnerable device comprising:
    adjusting the breakdown voltage of the vulnerable device in response to a sensed ESD event; and
    returning the vulnerable device to normal operation after the ESD event is over.

13. The method of claim 12, wherein the ESD event is sensed by an ESD event sensor.

14. The method of claim 12, wherein the vulnerable device comprises a transistor, and wherein the step of adjusting the breakdown voltage of the vulnerable device comprises reducing a voltage on a base of the transistor below a base-emitter turn-on voltage of the transistor.

15. The method of claim 12, wherein the vulnerable device is a transistor comprising a base, a collector, and an emitter; and wherein the step of adjusting the breakdown voltage of the vulnerable device comprises adjusting the breakdown voltage of the vulnerable device from the normal operating condition to a breakdown voltage from the collector to the emitter when the base is shorted to the emitter.

* * * * *

UNITED STATES PATENT AND TRADEMARK OFFICE
CERTIFICATE OF CORRECTION

PATENT NO. : 6,898,061 B1  
DATED : May 24, 2005  
INVENTOR(S) : Kimber et al.

Page 1 of 1

It is certified that error appears in the above-identified patent and that said Letters Patent is hereby corrected as shown below:

<u>Title page,</u>
Item [56], References Cited, OTHER PUBLICATIONS, delete the second occurrence of "Journal".

Signed and Sealed this

Twenty-second Day of November, 2005

JON W. DUDAS
*Director of the United States Patent and Trademark Office*